United States Patent
Hase et al.

(10) Patent No.: US 7,924,598 B2
(45) Date of Patent: Apr. 12, 2011

(54) NONVOLATILE SEMICONDUCTOR MEMORY

(75) Inventors: Mariko Hase, Tokyo (JP); Toshimasa Namekawa, Ota-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 12/547,892

(22) Filed: Aug. 26, 2009

(65) Prior Publication Data

US 2010/0177550 A1    Jul. 15, 2010

(30) Foreign Application Priority Data

Jan. 14, 2009   (JP) .................................. 2009-005336

(51) Int. Cl.
*G11C 17/16*   (2006.01)
(52) U.S. Cl. ..................... 365/100; 365/96; 365/185.23; 365/189.09; 365/225.7
(58) Field of Classification Search .................... 365/100
See application file for complete search history.

(56) References Cited

U.S. PATENT DOCUMENTS

| | | | |
|---|---|---|---|
| 6,147,908 A * | 11/2000 | Abugharbieh et al. | .... 365/185.2 |
| 7,046,569 B2 | 5/2006 | Ito et al. | |
| 7,345,903 B2 | 3/2008 | Nakano et al. | |
| 7,388,770 B2 | 6/2008 | Namekawa et al. | |
| 2008/0316852 A1 | 12/2008 | Matsufuji et al. | |

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

A nonvolatile semiconductor memory according to an aspect of the invention includes a memory cell array and a power supply circuit. The memory cell array includes memory cells each having an insulating film and being programmed to store information by inflicting an electric stress on the insulating film to break the insulating film. The power supply circuit supplies to the memory cell a program voltage for the electric stress depending on a negative temperature coefficient the electric stress.

20 Claims, 3 Drawing Sheets

NONVOLATILE SEMICONDUCTOR MEMORY

CROSS-REFERENCE TO RELATED APPLICATIONS

This application is based upon and claims the benefit of priority from the prior Japanese Patent Application No. 2009-5336, filed on Jan. 14, 2009, the entire contents of which are incorporated herein by reference.

BACKGROUND OF THE INVENTION

1. Field of the Invention

The present invention relates to a nonvolatile semiconductor memory, particularly to an OTP (One-Time Programmable) memory using an anti-fuse element.

2. Description of the Related Art

Recently, a nonvolatile memory which continuously retains information under the power off has been widely spread. In some applications of the nonvolatile memory, data is not repeatedly rewritten, but the data is written only once. As one of such applications, a nonvolatile semiconductor memory using an anti-fuse element has been proposed.

The anti-fuse element initially becomes a high-resistance state by a function of an insulating film in the anti-fuse element. However, when a high voltage for an electric stress is applied to the anti-fuse element once, a composition of the insulating film is broken to lower an electric resistance. Thereby, one-bit data can be recorded in a nonvolatile manner. In order to prevent false read, it is necessary to completely break the insulating film.

Generally, the breakdown feature of the insulating film depends on an applied voltage and an environmental temperature such that the time the insulating film is completely broken extends as the applied voltage or the environmental temperature decreases. Therefore, depending on the applied voltage or the environmental temperature, the insulating film is sometimes incompletely broken when the program operation is shortened. On the other hand, when the program operation is excessively lengthened, the excessive electric stress applied to the anti-fuse element, which causes a problem from the viewpoint of reliability.

For example, Japanese Patent Application Laid-Open (JP-A) No. 2006-196079 discloses a technique in order to solve the problems. In the technique disclosed in JP-A No. 2006-196079, a function of sensing an insulation breakdown state is provided in a power supply circuit that supplies a voltage to the anti-fuse memory element, and the application of the voltage to the anti-fuse memory element is maintained until the insulating film is completely broken. Therefore, not only a good read characteristic is obtained, but also the excessive electric stress is not applied to the anti-fuse memory element because the program operation is performed only for a necessary time.

However, in such cases, there is a problem that a program time varies by the applied voltage or the environmental temperature.

SUMMARY OF THE INVENTION

In accordance with a first aspect of the invention, a nonvolatile semiconductor memory includes a memory cell array that includes memory cells each having an insulating film and being programmed to store information by inflicting an electric stress on the insulating film to break the insulating film; and a power supply circuit that supplies to the memory cell a program voltage for the electric stress depending on a negative temperature coefficient.

In accordance with a second aspect of the invention, a nonvolatile semiconductor memory includes a memory cell array that includes memory cells each having an insulating film and being programmed to store information by inflicting an electric stress on the insulating film to break the insulating film, a time necessary to break the insulating film correlating with a temperature and the electric stress; and a power supply circuit that supplies to the memory cell a program voltage for the electric stress having the predetermined correlation with the temperature.

In accordance with a third aspect of the invention, a nonvolatile semiconductor memory includes a memory cell array that includes memory cells each having an insulating film and being programmed to store information by inflicting an electric stress on the insulating film to break the insulating film; and a power supply circuit that includes a band gap reference circuit, the band gap reference circuit including plural resistance elements and plural diodes to generate a reference voltage, the plurality for resistance elements including a variable resistive element the power supply circuit generating a program voltage for the electric stress to supply the program voltage to the memory cell based on the reference voltage.

DETAILED DESCRIPTION OF THE EMBODIMENTS

A nonvolatile semiconductor memory according to an exemplary embodiment of the invention will be described below with reference to the drawings.

[Characteristic of Anti-Fuse Memory Element]

A characteristic of an anti-fuse memory element used in the embodiment will be described prior to the specific embodiment of the invention.

The anti-fuse memory element has the substantially same structure as a normal MOS transistor, and information is stored based on whether a gate insulating film is broken or not. The gate insulating film is broken by applying a high voltage (hereinafter referred to as "program voltage"), and usually a pinhole having a diameter of about 50 nm is made by the breakage of the gate insulating film. Hereinafter a time until the pinhole is made since the program voltage is applied is referred to as "breakdown time".

Figure 1:
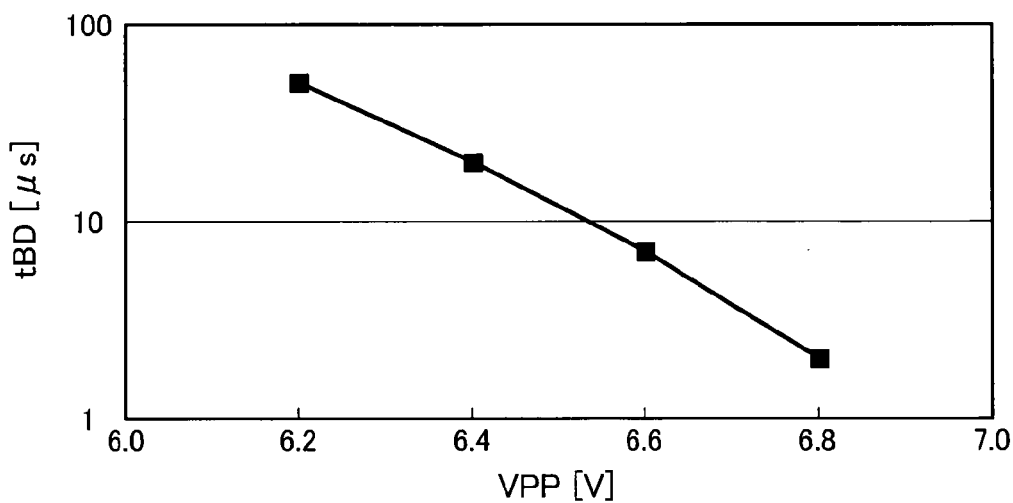
FIG. 1 is a graph illustrating voltage dependence of a breakdown time of a memory cell in a nonvolatile semiconductor memory according to an embodiment of the invention.

FIG. 1 is a graph illustrating voltage dependence of the breakdown time of the anti-fuse memory element. In FIG. 1, a horizontal axis indicates a program voltage VPP, and a vertical axis indicates a breakdown time tBD.

As can be seen from FIG. 1, the breakdown time tBD is about 30 µs at the program voltage VPP of 6.4 V, while the breakdown time tBD is about 3 μs at the program voltage VPP of 6.8 V. Therefore, the breakdown time tBD has a gradient of about −10 dB/0.4 V with respect to the program voltage VPP, and the breakdown time tBD has the high voltage dependence.

Figure 2:
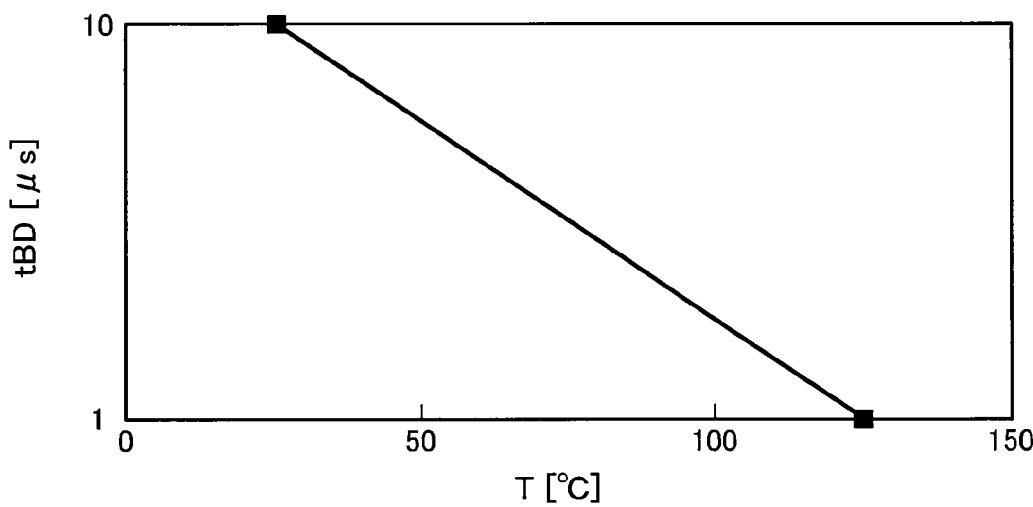
FIG. 2 is a graph illustrating temperature dependence of the breakdown time of the memory cell in the nonvolatile semiconductor memory of the embodiment.

FIG. 2 is a graph illustrating temperature dependence of the breakdown time of the anti-fuse memory element. In FIG. 2, a horizontal axis indicates an environmental temperature T, and a vertical axis indicates the breakdown time tBD.

As can be seen from FIG. 2, the breakdown time tBD is about 10 μs at the environmental temperature T of 25° C., while the breakdown time tBD is about 1 μs at the environmental temperature T of 125° C. Therefore, the breakdown time tBD has a gradient of about −10 dB/100 K with respect to the environmental temperature T, and the breakdown time tBD has the high temperature dependence.

Figure 3:
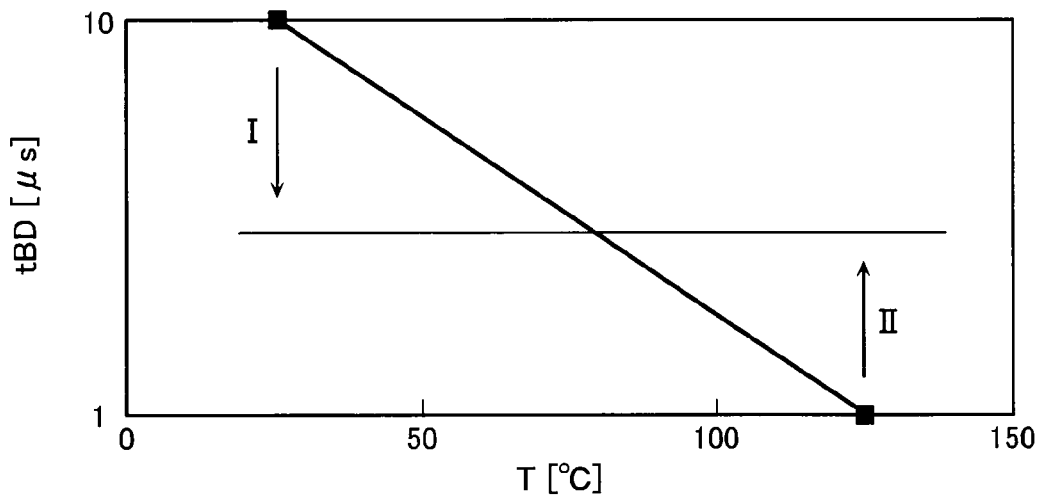
FIG. 3 illustrates an operating concept of the nonvolatile semiconductor memory of the embodiment.

In the embodiment, the breakdown time tBD is kept constant by utilizing the characteristics of FIGS. 1 and 2. That is, as illustrated in FIG. 3, the high program voltage VPP is applied at the low environmental temperature T (I in FIG. 3), and the low program voltage VPP is applied at the high environmental temperature T (II in FIG. 3). The temperature dependence can be cancelled by positively utilizing the voltage dependence of the breakdown time tBD of the anti-fuse memory element.

[Entire Configuration]

A configuration of the nonvolatile semiconductor memory of the embodiment will be described below.

Figure 4:
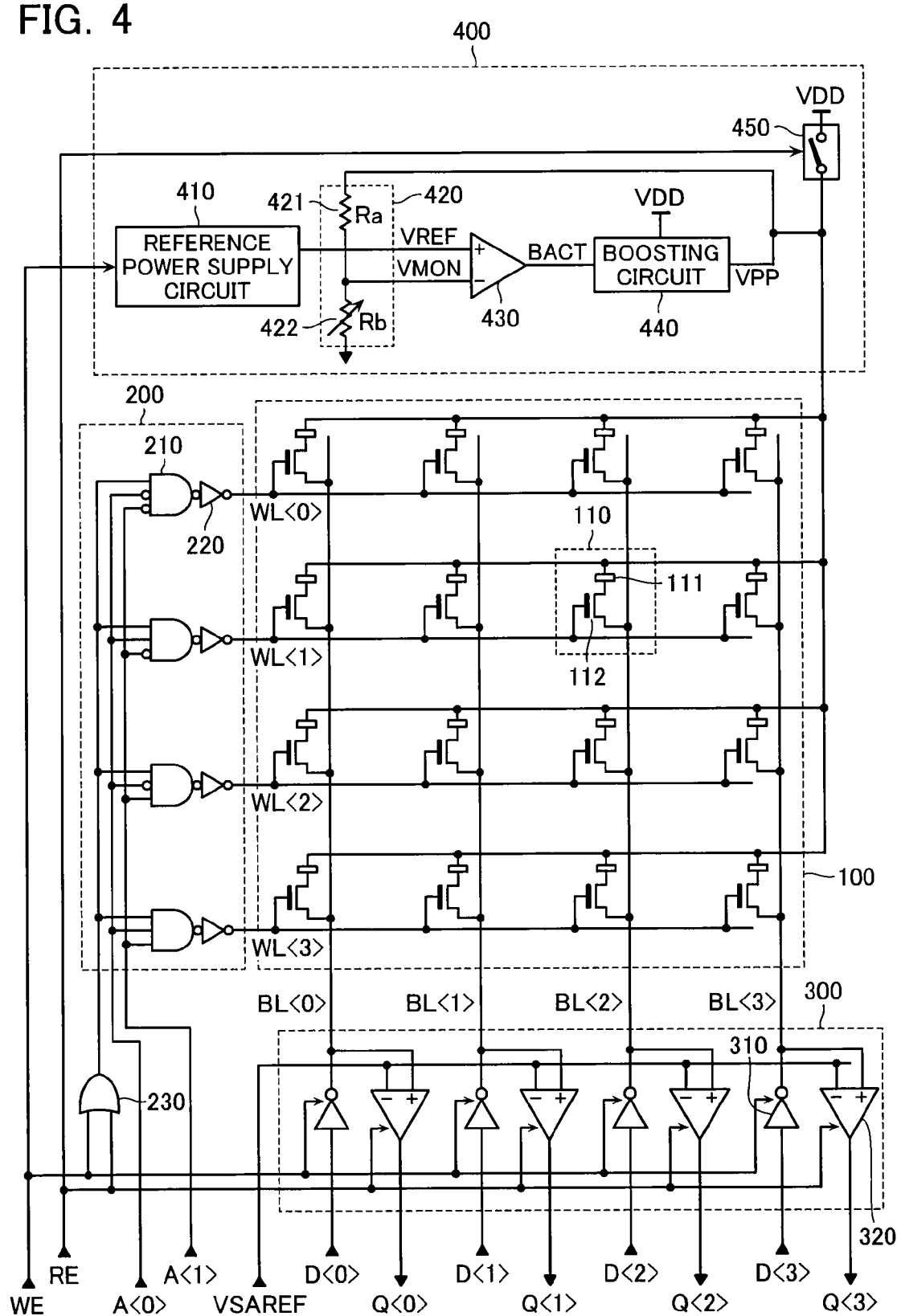
FIG. 4 is a block diagram partially illustrating the nonvolatile semiconductor memory of the embodiment.

FIG. 4 is a block diagram partially illustrating the nonvolatile semiconductor memory of the embodiment.

Referring to FIG. 4, the nonvolatile semiconductor memory includes a memory cell array 100. The memory cell array 100 includes plural word lines WL<0> to <3>, plural bit lines BL<0> to <3>, and plural memory cells 110. The word lines WL<0> to <3> and the bit lines BL<0> to <3> are orthogonal to each other. Each of the memory cells 110 is disposed in intersection portion of the word line and the bit line. The nonvolatile semiconductor memory also includes a row decoder 200 and a data buffer group 300. The row decoder 200 is disposed at one end of the word line WL to selectively activate the word line WL. The data buffer group 300 is disposed at one end of the bit line BL, the data buffer group 300 amplifies a minute signal from the memory cell 110 during data read, and the data buffer group 300 drives the bit line BL according to data from the outside. The nonvolatile semiconductor memory also includes a power supply circuit 400 that supplies the program voltage VPP to the memory cell 110.

Each memory cell 110 of the memory cell array 100 includes an anti-fuse element 111 and a selection transistor 112. Gates of the selection transistors 112 of the plural memory cells 110 arranged in the same row are commonly connected to each of the word lines WL<0> to WL<3>. Sources of the selection transistors 112 of the plural memory cells 110 arranged in the same column are commonly connected to each of the bit lines BL<0> to BL<3>. A drain of the selection transistor 112 is connected to one end of the anti-fuse element 111. On the other hand, the other end of the anti-fuse elements 111 is connected to an output terminal of the power supply circuit 400.

The row decoder 200 includes word line selection logic circuits 210 and word line driving circuits 220. The word line selection logic circuit 210 and the word line driving circuit 220 are connected to each of the word lines WL<0> to WL<3>. An output terminal of an OR gate 230 is connected to one of input terminals of the word line selection logic circuit 210, and a write instruction signal WE and a read instruction signal RE are fed into the OR gate 230. Address signals A<0> and A<1> are input to other input terminals of the word line selection logic circuit 210. Inverting processing and non-inverting processing are performed to the address signals A<0> and A<1> such that one word line WL is uniquely selected according to states of the address signals A<0> and A<1>, and the address signals A<0> and A<1> are fed into the word line selection logic circuit 210. An output of the word line selection logic circuit 210 is fed into the word line driving circuit 220. The word line driving circuit 220 inverts the input states to drive each of the word lines WL<0> to WL<3>.

The data buffer group 300 includes data buffers that are connected to the bit lines BL<0> to BL<3> respectively. Each data buffer includes a write buffer 310 and a sense amplifier 320. The write buffers 310 receive data input signals D<0> to D<3> to drive the bit lines BL<0> to BL<3> when a write instruction signal WE is fed. The sense amplifiers 320 amplify minute potential differences between bit lines BL<0> to BL<3> and a reference potential VSAREF to output data output signals Q<0> to Q<3> when a read instruction signal RE is fed.

The power supply circuit 400 includes a boosting circuit 440 and a reference power supply circuit 410. The boosting circuit 440 boosts a supply voltage VDD to supply the program voltage VPP. The reference power supply circuit 410 supplies the reference voltage VREF having a negative temperature coefficient (negative correlation with respect to temperature). The power supply circuit 400 also includes a voltage dividing circuit 420 and a differential amplifier 430. The voltage dividing circuit 420 includes series connection of a resistor 421 having a resistance value Ra and a variable resistor 422 having a resistance value Rb. The voltage dividing circuit 420 divides the fed back program voltage VPP to supply a monitor voltage VMON. The differential amplifier 430 compares the reference voltage VREF and the monitor voltage VMON, and the differential amplifier 430 supplies a boosting activation signal BACT according to the comparison result in order to activate the boosting circuit 440. The power supply circuit 400 also includes a power switch 450 that is controlled by a read instruction signal RE to impart the supply voltage VDD to the memory cell 110 during data read.

An operation of the nonvolatile semiconductor memory will be described below.

When the power supply circuit 400 receives the write signal WE, the reference power supply circuit 410 generates and supplies the reference voltage VREF having the negative temperature coefficient. The reference voltage VREF and the monitor voltage VMON supplied from the voltage dividing circuit 420 are fed into a non-inverting input terminal (+) and an inverting input terminal (−) of the differential amplifier 430, respectively. The differential amplifier 430 amplifies a difference between the reference voltage VREF and the monitor voltage VMON to generate the boosting activation signal BACT. The boosting activation signal BACT is transmitted to the boosting circuit 440. Accordingly, the boosting circuit 440 is activated to generate the program voltage VPP that is higher than the supply voltage VDD. The program voltage VPP is simultaneously supplied to the memory cell 110 and the voltage dividing circuit 420. The voltage dividing circuit 420 divides the program voltage VPP to supply the monitor voltage VMON from a connection point of the resistance element 421 and the variable resistive element 422. Even if using a fixed resistance element instead of the variable resistive element 422, the effect of the embodiment can be obtained. However, the use of the variable resistive element 422 can adjust a voltage dividing ratio to control a multiplying factor of the program voltage VPP to the reference voltage VREF.

When the power supply circuit 400 receives the read signal RE, the reference power supply circuit 410 is not activated. On the other hand, because the power switch 450 is turned on when the power supply circuit 400 receives the read signal RE, the supply voltage VDD is supplied to the memory cell 110.

[Reference Power Supply Circuit]

The reference power supply circuit 410 of the embodiment will be described below. The band gap reference circuit is used as the reference power supply circuit 410. A normal band gap reference circuit generates a reference voltage that does not have the temperature dependence. On the other hand, in the reference power supply circuit 410 of the embodiment, the reference voltage VREF having the negative temperature coefficient is obtained by adjusting the resistance value of the resistor constituting the band gap reference circuit.

Figure 5:
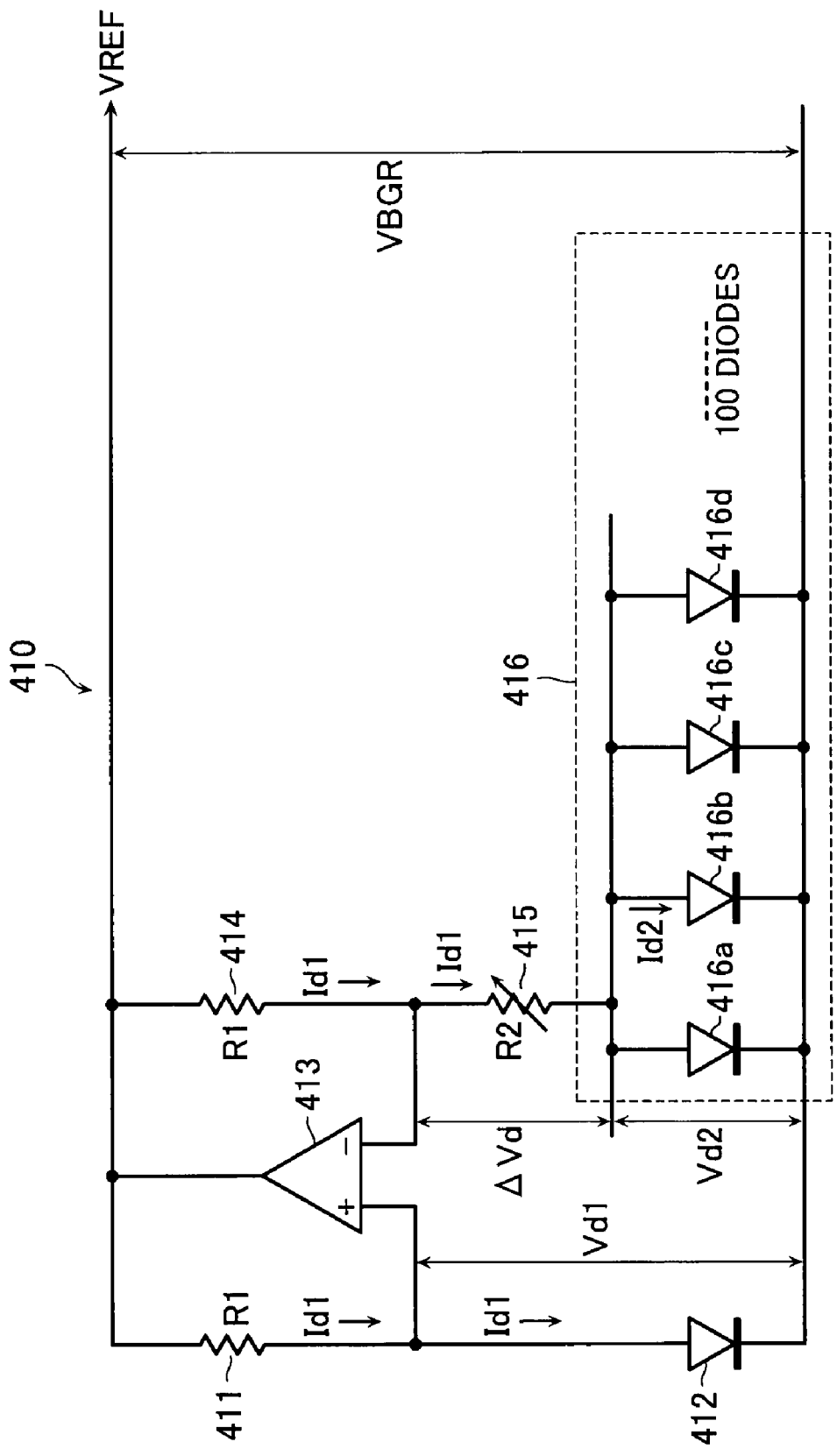
FIG. 5 is a circuit diagram illustrating a reference power supply voltage of the nonvolatile semiconductor memory of the embodiment.

FIG. 5 is a circuit diagram of the reference power supply circuit 410.

The reference power supply circuit 410 includes a first voltage generating circuit, a second voltage generating circuit, and an operational amplifying circuit 413. The first voltage generating circuit generates a first voltage from the reference voltage VREF. The second voltage generating circuit generates a second voltage from the reference voltage VREF. The first voltage and the second voltage are fed into the operational amplifying circuit 413, and the operational amplifying circuit 413 supplies the reference voltage VREF.

The first voltage generating circuit includes a series-connected circuit of a resistance element 411 having a resistance value R1 and a diode 412 whose anode is connected to the resistance element 411.

The second voltage generating circuit includes a series-connected of a resistance element 414, a variable resistive element 415, and a diode group 416. The resistance element 414 is equal to the resistance element 411. The variable resistive element 415 is means for adjusting the temperature coefficient. The diode group 416 includes 100 diodes 416a, 416b, ... that are connected in parallel. Each of the diodes 416a, 416b, ... constituting the diode group 416 has a characteristic equal to that of the diode 412 of the first voltage generating circuit.

A non-inverting input terminal (+) of the differential amplifier 413 is connected to a connection point of the resistance element 411 and the diode 412 of the first voltage generating circuit. On the other hand, an inverting input terminal (−) of the differential amplifier 413 is connected to a connection point of the resistance element 414 and the variable resistive element 415 of the second voltage generating circuit. An output terminal of the differential amplifier 413 supplies the reference voltage VREF, and the output terminal of the differential amplifier 413 is connected to the non-inverting input terminal (+) and the inverting input terminal (−) through the resistance element 411 and the resistance element 414.

At this point, the differential amplifier 413, the resistance element 414, the variable resistive element 415, and the diode group 416 constitute a feedback control circuit. Thereby, the output of the differential amplifier 413 as the reference voltage VREF is generated such that a voltage at the inverting input terminal (−) and a voltage at the non-inverting input terminal (+) of the differential amplifier 413 are equal to each other. As described above, one end of the resistance element 411 and one end of the resistance element 414 are commonly connected. On the other hand, because the other end of the resistance element 411 and the other end of the resistance element 414 are connected to the non-inverting input terminal (+) and inverting input terminal (−) of the differential amplifier 413, the input terminals of the differential amplifier 413 becomes the identical voltage by action of the feedback control circuit. Because the resistance elements 411 and 413 have the same resistance value R1, an identical current Id1 is passed through the resistance elements 411 and 414.

When the differential amplifier 413 is in a stable state, because no current flows into the non-inverting input terminal (+) of the differential amplifier 413, the current Id1 passed through the resistance element 411 is directly passed through the diode 412. A relationship between the current Id1 passed through the diode 412 and the voltage Vd1 between both ends of the diode 412 can be expressed as follows:

[Formula 1]

$$Id1 = Is1 \times \{\exp(Vd1 \times q/kB/T) - 1\} \quad (1)$$

Where Is1 is a reverse saturation current of the diode 412, q is an electron charge ($1.602 \times 10^{-19}$ C), kB is a Boltzmann constant ($1.381 \times 10^{-23}$ J/K), and T is the absolute temperature. At this point, assuming that the absolute temperature T is 300 K that is close to a room temperature, $kB \times T/q = 26$ mV is obtained. The equation (1) can be approximated to an equation (2) in a range where Vd1 is sufficiently larger than 26 mV:

[Formula 2]

$$Id1 = Is1 \times \exp(Vd1 \times q/kB/T) \quad (2)$$

The equation (2) is deformed to obtain an equation (3):

[Formula 3]

$$Vd1 = kB \times T/q \times \log(Id1/Is1) \quad (3)$$

Similarly, when the differential amplifier 413 is in the stable state, because no current flows into the non-inverting input terminal (−) of the differential amplifier 413, the current Id1 passed through the resistance element 414 is directly passed through the variable resistive element 415. A relationship between the current Id2 passed through the diode group 416 and the voltage Vd2 between both ends of the diode group 416 can be expressed as follows:

[Formula 4]

$$Vd2 = kB \times T/q \times \log(Id2/Is2) \quad (4)$$

At this point, the 100 diodes 416a, 416b, ... constituting the diode group 416 have the same characteristic as the diode 412, so that equations (5) and (6) can be derived:

[Formula 5]

$$Id1 = 100 \times Id2 \quad (5)$$

[Formula 6]

$$Is1 = Is2 = Is \quad (6)$$

Accordingly, a potential difference ΔVd between Vd1 and Vd2 can be expressed as follows:

[Formula 7]

$$\begin{aligned} \Delta Vd &= Vd1 - Vd2 \\ &= (kB/q \times T) \times \log(Id1/Id2) \\ &= (kB/q \times T) \times 4.6 \\ &= 0.0004 \times T \end{aligned} \quad (7)$$

That is, as can be seen from the equation (7), the potential difference ΔVd is proportional to the temperature with a positive gradient. For example, $\Delta Vd_{300K}=120$ mV is obtained at T=300 K, and $\Delta Vd_{400K}=160$ mV is obtained at T=400 K.

On the other hand, the voltage Vd between both the ends of the diode has a negative gradient with respect to the temperature:

[Formula 8]

$$d(Vd)/dT = -2m[V/K] \quad (8)$$

Because a normal band gap reference circuit generates a reference voltage VBGR that does not have the temperature dependence, a resistance ratio R1/R2 of the resistance elements 411 and 415 is adjusted such that the temperature coefficient -2 mV/K is cancelled.

The reference voltage VBGR can be expressed as follows:

[Formula 9]

$$VBGR = R1/R2 \times \Delta Vd + Vd1 \quad (9)$$

An equation (10) is obtained when both sides of the equation (9) are differentiated with respect to the temperature T:

[Formula 10]

$$d(VBGR)/dT = R1/R2 \times d(\Delta Vd)/dT + d(Vd)/dT \quad (10)$$

At this point, because of d(VBGR)/dT=0, R1/R2 is expressed as follows:

[Formula 11]

$$\begin{aligned} R1/R2 &= \{-d(Vd)/dT\}/\{d(\Delta Vd)/dT\} \\ &= 2m/0.4m \\ &= 5 \end{aligned} \quad (11)$$

On the other hand, in the reference power supply circuit 410 of the embodiment, R1/R2 is adjusted such that the output VREF has the temperature coefficient. It is assumed that the reference voltage VREF has the temperature coefficient of -0.5 mV/K.

The reference voltage VREF is expressed as follows:

[Formula 12]

$$VREF = R1/R2 \times \Delta Vd + Vd1 \quad (12)$$

An equation (13) is obtained when both sides of the equation (12) are differentiated with respect to the temperature T:

[Formula 13]

$$d(VREF)/dT = R1/R2 \times d(\Delta Vd)/dT + d(Vd)/dT \quad (13)$$

At this point, because of d(VREF)/dT=-0.5 mV/K, R1/R2 is expressed as follows:

[Formula 14]

$$\begin{aligned} R1/R2 &= \{d(VREF)/dT - d(Vd)/dT\}/\{d(\Delta Vd)/dT\} \\ &= (-0.5m + 2m)/0.4m \\ &= 3.75 \end{aligned} \quad (14)$$

In the reference power supply circuit 410, assuming that $Vd1_{300K}=0.6$ V is the voltage between the ends of the diode 412 at the absolute temperature T=300 K, $\Delta Vd_{300K}=120$ mV and R1/R2=3.75 are obtained. Therefore, the reference voltage $VREF_{300K}$ is obtained at the absolute temperature T=300 K by an equation (15):

[Formula 15]

$$\begin{aligned} VREF_{300K} &= R1/R2 \times \Delta Vd_{300K} + Vd1_{300K} \\ &= 3.75 \times 120m + 0.6 \\ &= 1.05[V] \end{aligned} \quad (15)$$

At the absolute temperature T=400 K, because the temperature coefficient of the diode 412 becomes d(Vd)/dT=-2 mV/K, $\Delta Vd_{400K}=160$ mV, R1/R2=3.75, the reference voltage $VREF_{400K}$ is expressed as follows:

[Formula 16]

$$\begin{aligned} VREF_{400K} &= R1/R2 \times \Delta Vd_{400K} + (Vd1_{300K} - 2m \times 100) \\ &= 3.75 \times 160m + 0.6 - 2m \times 100 \\ &= 1[V] \end{aligned} \quad (16)$$

The obtained reference power supply VREF having the negative temperature dependence is fed into the non-inverting input terminal (+) of the differential amplifier 430. On the other hand, the monitor voltage VMON generated by the voltage dividing circuit 420 is fed into the inverting input terminal (−) of the differential amplifier 430. Because the voltage dividing circuit 420, the differential amplifier 430, and the boosting circuit 440 constitute the feedback control circuit, the program voltage VPP is controlled such that the reference power supply VREF is equal to the monitor voltage VMON. That is, the program voltage VPP is expressed from a voltage dividing ratio Rb/(Ra+Rb) of the voltage dividing circuit 420 by an equation (17):

[Formula 17]

$$VPP = (Ra+Rb)/Rb \times VREF \quad (17)$$

At this point, Rb is set to 10 kΩ and Ra is set to 50 kΩ such that the voltage dividing ratio Rb/(Ra+Rb) becomes ⅙. In such cases, the reference voltage $VREF_{300K}$ is 1.05 V at the absolute temperature T=300 K, the reference voltage $VREF_{400K}$ is 1.0V at the absolute temperature T=400 K. Therefore, the program voltage $VPP_{300K}$ at the absolute temperature T=300 K and the program voltage $VPP_{400K}$ at the absolute temperature T=400 K are expressed as follows:

[Formula 18]

$$\begin{aligned} VPP_{300K} &= 6 \times VREF_{300K} \\ &= 6 \times 1.05 \\ &= 6.3[V] \end{aligned} \quad (18)$$

[Formula 19]

$$\begin{aligned} VPP_{400K} &= 6 \times VREF_{400K} \\ &= 6 \times 1.0 \\ &= 6.0[V] \end{aligned} \quad (19)$$

The generated program voltage VPP is supplied to the anti-fuse element 110 during data write. The anti-fuse element 110 has a characteristic in which the breakdown time is shortened to $\frac{1}{10}$ when the program voltage is increased by 0.3 V. The anti-fuse element 110 also has a characteristic in which the breakdown time is shortened to $\frac{1}{10}$ when the environmental temperature is raised by 100° C. Accordingly, the program voltage VPP having the temperature dependence is supplied to the anti-fuse element 110, so that the breakdown time can be kept constant irrespective of the environmental temperature.

Even if using a fixed resistance element instead of the variable resistive element 415, the effect of the embodiment can be obtained. However, the use of the variable resistive element 415 can easily adjust the temperature coefficient of the reference voltage VREF.

[Write Operation and Read Operation]

An operation of the nonvolatile semiconductor memory of the embodiment will be described below.

First the write instruction signal WE is fed in a write operation. When receiving the write instruction signal WE, the power supply circuit 400 generates the program voltage VPP. At the same time, the row decoder 200 selects any one of the word lines WL according to the states of the address signals A<0> and A<1>.

Then, for example, data "1" is fed into a data input terminal of the write buffer 310 that drives the bit line BL connected to the memory cell 110 of the write target. In such cases, the write buffer 310 drives the bit line BL in a low-voltage state. Thereby, the selection transistor 112 of the memory cell 110 that becomes write target is turned on to lower the voltage at the connection point with the anti-fuse element 111. Through the series of operations, a high voltage that becomes an electric stress is applied to any anti-fuse element 111. Because the application of the high voltage to the anti-fuse element 111 is maintained for a while, the insulating film of the anti-fuse element 111 is broken to become the low-resistance state.

Finally the write instruction signal WE is inactivated to complete the write operation.

On the other hand, first the read instruction signal RE is fed in a read operation. When receiving the read instruction signal RE, the power switch 450 directly connects the supply voltage VDD and the program voltage VPP. Therefore, the voltage necessary for the data read is supplied to all the anti-fuse elements 111 in the cell array 100 without breaking the insulating film of the anti-fuse element 111. At the same time, when receiving the read instruction signal RE, the row decoder 200 selects any one of word lines WL according to the states of the address signals A<0> and A<1>. Accordingly, the anti-fuse element 111 and the bit line BL are electrically connected by the selection transistor 112 connected to the selected word line WL. When the insulating film of the anti-fuse element 111 is broken, the supply voltage VDD is electrically connected to the selected bit line BL through the anti-fuse element 111, thereby increasing the voltage at the bit line BL. On the other hand, when the insulating film of the anti-fuse element 111 is not broken, because the anti-fuse element 111 becomes an electrically insulating state, the voltage at the bit line BL is maintained at a low level.

Finally the sense amplifier 320 amplifies a different between the voltage at the bit line BL and the voltage at the sense amplifier reference voltage VSAREF, and the amplified difference is supplied as the data output signals Q<0> to Q<3>.

As described above, the anti-fuse element has the characteristic in which the breakdown is generated early as the program voltage or environmental temperature is increased. Accordingly, the breakdown time is lengthened at the low environmental temperature, and a risk of false write is increased at the high environmental temperature.

On the other hand, in the embodiment, the program voltage VPP that is higher than usual is supplied to the anti-fuse element 111 at the low environmental temperature, so that the breakdown time can be shortened. The program voltage VPP that is lower than usual is supplied to the anti-fuse element 111 at the high environmental temperature, so that the risk of false write can be reduced.

Therefore, the nonvolatile semiconductor memory, in which the write speed is kept constant irrespective of the environmental temperature and the risk of false write is lowered, can be provided.

What is claimed is:

1. A nonvolatile semiconductor memory comprising:
   a memory cell array that includes memory cells each having an insulating film and being programmed to store information by inflicting an electric stress on the insulating film to break the insulating film; and
   a power supply circuit that supplies to the memory cell a program voltage for the electric stress depending on a negative temperature coefficient.

2. The nonvolatile semiconductor memory according to claim 1, wherein the power supply circuit includes:
   a boosting circuit that boosts a supply voltage to generate the program voltage;
   a differential amplifier that compares a monitor voltage corresponding to the program voltage and a reference voltage to activate the boosting circuit according to the comparison result; and
   a reference power supply circuit that generates the reference voltage having the negative temperature coefficient.

3. The nonvolatile semiconductor memory according to claim 2, wherein the power supply circuit includes a voltage dividing circuit comprising a resistance element and a variable resistive element which are connected in series, and dividing the program voltage to generate the monitor voltage.

4. The nonvolatile semiconductor memory according to claim 2, wherein the reference power supply circuit includes a band gap reference circuit having means for adjusting the temperature coefficient.

5. The nonvolatile semiconductor memory according to claim 4, wherein the temperature coefficient adjusting means of the reference power supply circuit is a variable resistive element.

6. The nonvolatile semiconductor memory according to claim 2, wherein the reference power supply circuit includes:
   a first voltage generating circuit comprising a plurality of parallel-connected diodes, a variable resistive element and resistance element being connected in series, and dividing the reference voltage to generate a first voltage;

a second voltage generating circuit comprising a diode and a resistance element being connected in series, and dividing the reference voltage to generate a second voltage; and an operational amplifying circuit inputting the first and second voltages, and outputting the reference voltage.

7. The nonvolatile semiconductor memory according to claim 2, wherein the power supply circuit supplies the program voltage to the memory cell during a program operation, and supplies the supply voltage to the memory cell during a read operation.

8. A nonvolatile semiconductor memory comprising:
a memory cell array that includes memory cells each having an insulating film and being programmed to store information by inflicting an electric stress on the insulating film to break the insulating film, a time necessary to break the insulating film correlating with a temperature and the electric stress; and
a power supply circuit that supplies to the memory cell a program voltage for the electric stress having the predetermined correlation with the temperature.

9. The nonvolatile semiconductor memory according to claim 8, wherein the predetermined correlation is a negative correlation.

10. The nonvolatile semiconductor memory according to claim 8, wherein the power supply circuit includes:
a boosting circuit that boosts a supply voltage to generate the program voltage;
a differential amplifier that compares a monitor voltage corresponding to the program voltage and a reference voltage to activate the boosting circuit according to the comparison result; and
a reference power supply circuit that generates the reference voltage having the predetermined correlation with the temperature.

11. The nonvolatile semiconductor memory according to claim 10, wherein the power supply circuit includes a voltage dividing circuit comprising a resistance element and a variable resistive element which are connected in series, and dividing the program voltage to generate the monitor voltage.

12. The nonvolatile semiconductor memory according to claim 10, wherein the reference power supply circuit includes a band gap reference circuit having means for adjusting the temperature coefficient.

13. The nonvolatile semiconductor memory according to claim 12, wherein the temperature coefficient adjusting means of the reference power supply circuit is a variable resistive element.

14. The nonvolatile semiconductor memory according to claim 10, wherein the reference power supply circuit includes:
a first voltage generating circuit comprising a plurality of parallel-connected diodes, a variable resistive element, and resistance element being connected in series and dividing the reference voltage to generate a first voltage;
a second voltage generating circuit comprising a diode and a resistance element being connected in series, and dividing the reference voltage to generate a second voltage; and
an operational amplifying circuit inputting the first and second voltages, and outputting the reference voltage.

15. The nonvolatile semiconductor memory according to claim 10, wherein the power supply circuit supplies the program voltage to the memory cell during a program operation, and supplies the supply voltage to the memory cell during a read operation.

16. A nonvolatile semiconductor memory comprising:
a memory cell array that includes memory cells each having an insulating film and being programmed to store information by inflicting an electric stress on the insulating film to break the insulating film; and
a power supply circuit that includes a band gap reference circuit, the band gap reference circuit including a plurality of resistance elements and a plurality of diodes to generate a reference voltage, the plurality of resistance elements including a variable resistive element, the power supply circuit generating a program voltage for the electric stress to the memory cell based on the reference voltage.

17. The nonvolatile semiconductor memory according to claim 16, wherein the power supply circuit includes:
a boosting circuit that boosts a supply voltage to generate the program voltage; and
a differential amplifier that compares a monitor voltage corresponding to the program voltage and a reference voltage to activate the boosting circuit according to the comparison result.

18. The nonvolatile semiconductor memory according to claim 17, wherein the power supply circuit includes a voltage dividing circuit comprising a resistance element and a variable resistive element which are connected in series, and dividing the program voltage to generate the monitor voltage.

19. The nonvolatile semiconductor memory according to claim 16, wherein the reference power supply circuit includes:
a first voltage generating circuit comprising a plurality of parallel-connected diodes, a variable resistive element and resistance element being connected in series, and dividing the reference voltage to generate a first voltage;
a second voltage generating circuit comprising a diode and a resistance element being connected in series, and dividing the reference voltage to generate a second voltage; and
an operational amplifying circuit inputting the first and second voltages, and outputting the reference voltage.

20. The nonvolatile semiconductor memory according to claim 16, wherein the power supply circuit supplies the program voltage to the memory cell during a program operation, and supplies the supply voltage to the memory cell during a read operation.

* * * * *